US012327903B2

(12) United States Patent
Marek et al.

(10) Patent No.: US 12,327,903 B2
(45) Date of Patent: *Jun. 10, 2025

(54) COMPACT THIN FILM SURFACE MOUNTABLE COUPLER HAVING WIDE-BAND PERFORMANCE

(71) Applicant: KYOCERA AVX Components Corporation, Fountain Inn, SC (US)

(72) Inventors: Michael Marek, Jerusalem (IL); Elinor O'Neill, Jerusalem (IL); Ronit Nissim, Jerusalem (IL)

(73) Assignee: KYOCERA AVX Components Corporation, Fountain Inn, SC (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/902,338

(22) Filed: Sep. 2, 2022

(65) Prior Publication Data
US 2023/0006326 A1    Jan. 5, 2023

Related U.S. Application Data

(63) Continuation of application No. 16/810,974, filed on Mar. 6, 2020, now Pat. No. 11,437,695.
(Continued)

(51) Int. Cl.
*H01P 5/12* (2006.01)
*H01P 11/00* (2006.01)
(Continued)

(52) U.S. Cl.
CPC .............. *H01P 5/12* (2013.01); *H01P 11/00* (2013.01); *H05K 1/0243* (2013.01);
(Continued)

(58) Field of Classification Search
CPC ......... H01P 5/12; H01P 11/00; H05K 1/0243; H05K 1/0306; H05K 1/165; H05K 1/167; H05K 3/303
See application file for complete search history.

(56) References Cited

U.S. PATENT DOCUMENTS

| 4,298,856 A | 11/1981 | Schuchardt |
| 4,777,458 A | 10/1988 | Pardini |

(Continued)

FOREIGN PATENT DOCUMENTS

| CN | 106330167 A | 1/2017 |
| JP | H 10290108 A | 10/1998 |

(Continued)

OTHER PUBLICATIONS

Product Information—DC to 40GHz 20dB Resistive Coupler from Dielectric Laboratories and Knowles Capacitors, Mar. 2017, 2 pages.

(Continued)

*Primary Examiner* — Andrea Lindgren Baltzell
*Assistant Examiner* — Kimberly E Glenn
(74) *Attorney, Agent, or Firm* — Dority & Manning, P.A.

(57) ABSTRACT

A surface mountable coupler may include a monolithic base substrate having a first surface, a second surface, a length in an X-direction, and a width in a Y-direction that is perpendicular to the X-direction. A plurality of ports may be formed over the first surface of the monolithic base substrate including a coupling port, an input port, and an output port. The coupler may include a first thin film inductor and a second thin film inductor that is inductively coupled with the first thin film inductor and electrically connected between the input and output ports. A thin film circuit may electrically connect the first thin film inductor with the coupling port. The thin film circuit may include at least one thin film component.

28 Claims, 5 Drawing Sheets

Related U.S. Application Data

(60) Provisional application No. 62/817,647, filed on Mar. 13, 2019.

(51) Int. Cl.
  *H05K 1/02* (2006.01)
  *H05K 1/03* (2006.01)
  *H05K 1/16* (2006.01)
  *H05K 3/30* (2006.01)

(52) U.S. Cl.
  CPC .......... *H05K 1/0306* (2013.01); *H05K 1/165* (2013.01); *H05K 1/167* (2013.01); *H05K 3/303* (2013.01)

(56) References Cited

U.S. PATENT DOCUMENTS

| | | |
|---|---|---|
| 6,600,386 B1 | 7/2003 | Löbl et al. |
| 7,084,715 B2 | 8/2006 | Al-Taci et al. |
| 7,132,906 B2 | 11/2006 | Podell |
| 7,187,250 B2 | 3/2007 | Matters-Kammerer et al. |
| 7,190,240 B2 | 3/2007 | Podell |
| 7,345,557 B2 | 3/2008 | Podell |
| 7,493,128 B2 | 2/2009 | Tang et al. |
| 8,035,458 B2 | 10/2011 | Frye et al. |
| 8,289,102 B2 | 10/2012 | Yamamoto et al. |
| 8,791,770 B2 | 7/2014 | Mori |
| 8,803,633 B2 | 8/2014 | Tokuda et al. |
| 9,000,864 B2 | 4/2015 | Tanaka |
| 9,263,786 B2 | 2/2016 | Suga et al. |
| 10,763,032 B2 | 9/2020 | Kim et al. |
| 11,437,695 B2* | 9/2022 | Marek .................. H05K 3/303 |
| 2014/0368293 A1* | 12/2014 | Mukaiyama ........... H03H 7/383 |
| | | 333/116 |
| 2020/0212862 A1 | 7/2020 | Hulsteijn et al. |

FOREIGN PATENT DOCUMENTS

| | | |
|---|---|---|
| JP | 2002141713 A | 5/2002 |
| JP | 2013046305 A | 3/2013 |
| JP | 2014068211 A | 4/2014 |
| WO | WO 2016/008658 A1 | 1/2016 |

OTHER PUBLICATIONS

Product Information—20 to 40GHz 10dB Directional Coupler (FPC07182-Preliminary) from Dielectric Laboratories and Knowles Capacitors, May 2015, 2 pages.

Product Information—Multilayer Direction Coupler for 2400-2500MHz / 4900-5850MHz HHM2510B1 from TKD, Apr. 2015, 7 pages.

International Search Report and Written Opinion for PCT/US2020/021393 dated Jul. 2, 2020, 16 pages.

Chinese Search Report for CN Application No. 202080020892.5 dated Jan. 5, 2022, 2 pages.

* cited by examiner

COMPACT THIN FILM SURFACE MOUNTABLE COUPLER HAVING WIDE-BAND PERFORMANCE

CROSS REFERENCE TO RELATED APPLICATIONS

The present application is a continuation of U.S. application Ser. No. 16/810,974, filed on Mar. 6, 2020, which claims filing benefit of U.S. Provisional Patent Application Ser. No. 62/817,647 having a filing date of Mar. 13, 2019, which are incorporated herein by reference in their entirety.

BACKGROUND OF THE INVENTION

Thin film couplers generally couple a source line with a coupled line without direct electrical contact to duplicate an electrical signal present in the signal line in the coupled line. A coupling frequency range is generally defined as a frequency range across which the thin film coupler provides relatively even coupling performance. Narrow coupling frequency ranges can limit the usefulness of such thin film couplers.

A trend towards miniaturization has increased the desirability of small, passive couplers. Miniaturization, however, has increased the difficulty of surface mounting such small couplers. Thus, a compact surface mountable thin film coupler having a wide coupling frequency range would be welcomed in the art.

SUMMARY

In accordance with one embodiment of the present invention, a surface mountable coupler may include a monolithic base substrate having a first surface, a second surface, a length in an X-direction, and a width in a Y-direction that is perpendicular to the X-direction. A plurality of ports may be formed over the first surface of the monolithic base substrate include a coupling port, an input port, and an output port. The coupler may include a first thin film inductor and a second thin film inductor that is inductively coupled with the first thin film inductor and electrically connected between the input and output ports. A thin film circuit may electrically connect the first thin film inductor with the coupling port. The thin film circuit may include at least one thin film component.

In accordance with another embodiment of the present invention, a surface mountable coupler is disclosed. The coupler may include a monolithic base substrate, at least one port exposed along an exterior of the coupler for surface mounting the coupler, and at least one thin film component. A footprint of the coupler is less than about 3 $mm^2$. A coupling factor of the coupler may vary less than about 4 dB across a coupling frequency range that has a lower limit that range from about 250 MHz to about 6 GHz and an upper limit that is at least 2 GHz greater than the lower limit.

In accordance with another aspect of the present invention, a method for forming a surface mountable coupler may include providing a monolithic base substrate having a first surface, a second surface opposite the bottom surface. The method may include forming a plurality of ports over the first surface of the monolithic base substrate. The method may include forming a first thin film inductor and forming a second thin film inductor that is inductively coupled with the first thin film inductor and electrically connected between the input and output ports. The method may include forming a thin film circuit electrically connecting the first thin film inductor with the coupling port. The thin film circuit may include at least one thin film component.

BRIEF DESCRIPTION OF THE DRAWINGS

A full and enabling disclosure of the present invention, including the best mode thereof, directed to one of ordinary skill in the art, is set forth in the specification, which makes reference to the appended Figures, in which.

Figure 1:
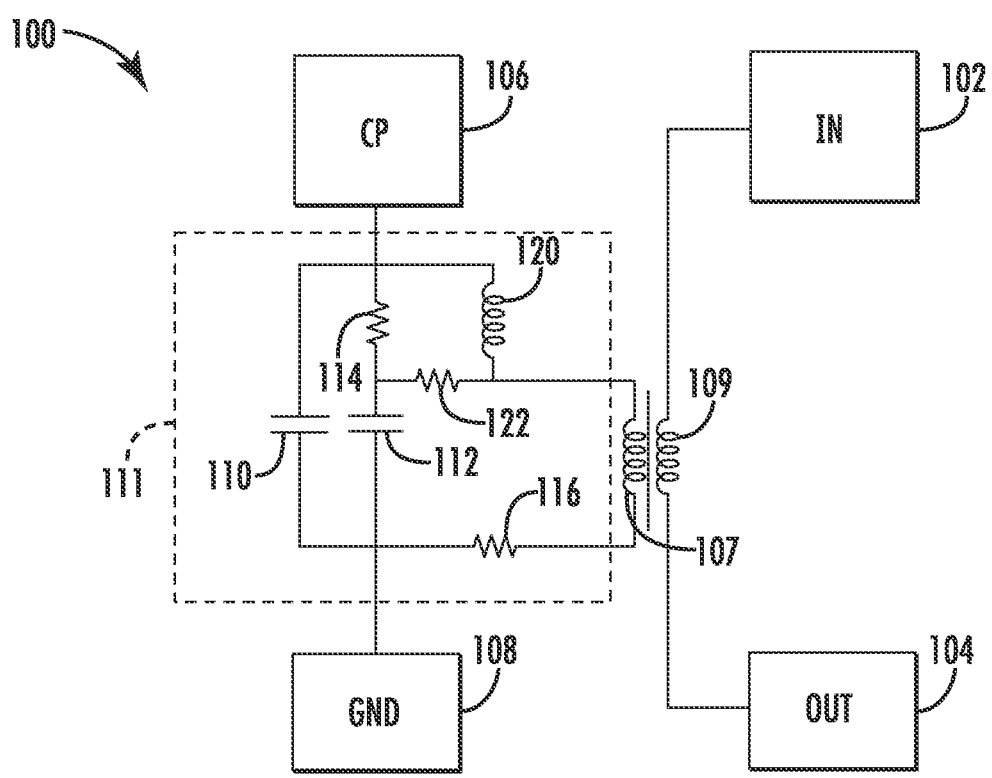
FIG. 1 illustrates a schematic view of a compact thin film surface mountable coupler in accordance with aspects of the present disclosure.

Repeat use of reference characters throughout the present specification and appended drawings is intended to represent same or analogous features or elements of the invention.

DETAILED DESCRIPTION OF REPRESENTATIVE EMBODIMENTS

A thin film coupler is provided that provides even coupling across a wide frequency range in compact surface mountable package. Couplers generally provide coupling between two signal lines without direct electrical contact.

The coupler may generally include a monolithic base substrate. At least one port (e.g., an input port, output port, coupling port, and/or ground port) may be exposed along an exterior of the coupler for surface mounting the coupler, for example using grid array-type mounting (e.g., land grid array (LGA) type mounting, ball grid array (BGA) type, etc.). The coupler may include at least one thin film component configured to produce a coupled signal in the coupling port (e.g., with respect to the ground port) in response to an input signal received by the input port. For example, in some embodiments, the coupler may include a first thin film inductor and a second thin film inductor that is inductively coupled with the first thin film inductor. The second thin film inductor may be inductively coupled with the first thin film inductor and electrically connected between the input and the output ports. A thin film circuit may electrically connect the first thin film inductor with the coupling port and/or ground port.

In some embodiments, the thin film coupler may be compact. For example, the coupler may have a small footprint and thus require less space for mounting on a printed circuit board. The coupler may have a footprint of less than about 3 $mm^2$, in some embodiments less than about 2.5 $mm^2$, in some embodiments less than about 2.0 $mm^2$, in some embodiments less than about 1.5 $mm^2$, in some embodiments less than about 1.0 $mm^2$, in some embodiments less than about 0.8 $mm^2$, and in some embodiments less than about 0.6 $mm^2$.

The coupler may have a length that is less than about 2.0 mm, in some embodiments less than about 1.8 mm, in some embodiments less than about 1.5 mm, and in some embodiments less than about 1.1 mm. A width of the coupler may be less than about 1.2 mm, in some embodiments less than about 1 mm, in some embodiments less than about 0.8 mm, in some embodiments less than about 0.7 mm, and in some embodiments less than about 0.6 mm. In some embodiments, the thin film coupler may have an EIA case size of 1206, 805, 0504, 0402, 0303, 0202, or smaller.

The thin film coupler may exhibit an even coupling factor across a coupling frequency range. For example, the coupling factor may vary less than about 4 dB across the coupling frequency range, in some embodiments less than about 3.8 dB, in some embodiments less than about 3.6 dB, in some embodiments less than about 3.4 dB, in some embodiments less than about 3.2 dB, and in some embodiments less than about 3.1 dB.

The coupling frequency range may have a lower limit (e.g., about 2 GHz) and an upper limit that is at least 2 GHz greater than the lower limit, in some embodiments at least about 4.5 GHz, in some embodiments at least about 5 GHz, in some embodiments at least about 5.5 GHz, in some embodiments at least about 6 GHz, in some embodiments at least about 8 GHz, in some embodiments at least about 10 GHz, and in some embodiments at least about 12 GHz. The lower limit may range from about 250 MHz to about 6 GHz, in some embodiments, in some embodiments from about 500 MHz to about 5 GHz, in some embodiments from about 750 MHz to about 2 GHz, and in some embodiments from about 1 GHz to about 3 GHz.

As indicated above, a thin film circuit may electrically connect the first thin film inductor with the coupling port. The thin film circuit may include one or more thin film resistors, one or more thin film inductors, and/or one or more thin film capacitors. For example, the thin film circuit may include a third thin film inductor and a thin film capacitor that are electrically connected in parallel with each other. The third thin film inductor and the thin film capacitor may be electrically connected in series between the first thin film inductor and the coupling port.

In some embodiments, at least a portion of one or more of the thin film elements may be formed over a dielectric layer that may be formed over a surface of the monolithic base substrate. The dielectric layer may have a first surface and a second surface. The second surface of the dielectric layer may face the first surface of the monolithic base substrate. However, it should be understood that one or intermediate layers may be between the dielectric layer and the monolithic base substrate.

As used herein, "formed over," may refer to a layer that is directly in contact with another layer. However, intermediate layers may also be formed therebetween. Additionally, when used in reference to a bottom surface, "formed over" may be used relative to an exterior surface of the component. Thus, a layer that is "formed over" a bottom surface may be closer to the exterior of the component than the layer over which it is formed.

The thin film inductor may include a first conductive layer formed over the first surface of the monolithic base substrate. A second conductive layer of the thin film inductor may be formed over the first surface of the dielectric layer. A via may connect the first conductive layer with the second conductive layer.

As another example, a thin film capacitor may include electrodes that are spaced apart by at least the thickness of the dielectric layer. The thin film capacitor may include a first electrode formed over the first surface of the monolithic base substrate and a second electrode formed over a first surface of the dielectric layer.

At least portions of the first and second inductors may be elongated and parallel with each other to facilitate induction of signals in the second thin film inductor by the first thin film inductor. More specifically, the first inductor may include a first conductive layer that is elongated in a first direction in the X-Y plane. The second inductor may include a second conductive layer that is parallel with the first conductive layer and spaced apart from the first conductive layer in a second direction in the X-Y plane that is perpendicular to the first direction by an approximately even spacing distance along at least a portion of the first conductive layer. The spacing distance may range from about 1 micron to about 100 microns, in some embodiments from about 5 microns to about 80 microns, in some embodiments from about 10 microns to about 30 microns.

In some embodiments, a cover layer may be formed over the second surface of the dielectric layer. For example, the cover layer may be formed directly on the second surface of the dielectric layer, or one or more intermediate layers may be between the cover layer and dielectric layer. For instance, a metallic intermediate layer may be between the cover layer and dielectric layer.

The cover layer may include a suitable ceramic dielectric material, for example as described below. The cover layer may have a thickness that ranges from about 100 microns to about 600 microns, in some embodiments from about 125 microns to about 500 microns, in some embodiments from about 150 microns to about 400 microns, and in some embodiments from about 175 microns to about 300 microns.

The base substrate, dielectric layer, and/or cover layer may comprise one or more suitable ceramic materials. Suitable materials are generally electrically insulating and thermally conductive. Example materials include silicon oxynitride, silicon nitride, silicon oxide, barium titanate, strontium titanate, strontium barium titanate, bismuth strontium tantalate, tantalum, niobium, oxides or nitrides or such materials, NPO (COG), X7R, X7S, Z5U, Y5V formulations, lead-based materials such as doped or non-doped PZT dielectrics, and others. Additional examples include alumina, aluminum nitride, beryllium oxide, aluminum oxide, boron nitride, silicon, silicon carbide, silica, gallium arsenide, gallium nitride, zirconium dioxide, mixtures thereof, oxides and/or nitrides of such materials, or any other suitable ceramic material. Additional ceramic materials include calcium titanate ($CaTiO_3$), zinc oxide (ZnO), ceramics containing low-fire glass, and other glass-bonded materials.

In some embodiments, one or more of the base substrate, dielectric layer, and/or cover layer may comprise sapphire or ruby. Sapphire and ruby are types of corundum, which is a crystalline form of aluminum oxide (a ceramic material) containing additional trace materials. A substrate comprising sapphire may provide several benefits including excellent electrical insulation, heat dissipation, and high temperature stability. Additionally, because sapphire is generally transparent, internal features of the coupler may be visually inspected, reducing the time and difficulty associated with checking completed components for quality.

The base substrate, dielectric layer, and/or cover layer may include a material having a dielectric constant that is less than about 30 as determined in accordance with ASTM D2149-13 at an operating temperature of 25° C. and frequency of 1 kHz, in some embodiments less than about 25, in some embodiments less than about 20, and in some embodiments less than about 15. However, in other embodiments, a material having a dielectric constant higher than 30 may be used to achieve higher frequencies and/or smaller components. For example, in such embodiments, the dielectric constant may range from about 30 to about 120, or greater, as determined in accordance with ASTM D2149-13 at an operating temperature of 25° C. and frequency of 1 kHz, in some embodiments from about 50 to about 100, and in some embodiments from about 70 to about 90.

The thin film components may be formed of a variety of suitable materials. For example, the thin film resistor may include a resistive layer, which may be formed from a variety of suitable resistive materials. For example, the resistive layer may include tantalum nitride (TaN), nickel chromium (NiCr), tantalum aluminide, chromium silicon, titanium nitride, titanium tungsten, tantalum tungsten, oxides and/or nitrides of such materials, and/or any other suitable thin film resistive materials.

The thin film inductors and/or capacitors may include conductive layers. The conductive layers may include a variety of suitable conductive materials. Example conductive materials include copper, nickel, gold, tin, lead, palladium, silver, and alloys thereof. Any conductive metallic or non-metallic material that is suitable for thin film fabrication may be used, however.

The layers of thin film component(s) may have thicknesses that are about 50 micrometers or less, in some embodiments 20 micrometers or less, in some embodiments 10 micrometers or less, and in some embodiments 5 micrometers or less. For example, in some embodiments the thickness of the thin film components may range from about 0.05 micrometers to about 50 micrometers, in some embodiments from about 0.1 micrometers to about 20 micrometers, in some embodiments from about 0.3 micrometer to about 10 micrometers, in some embodiments from about 1 micrometer to about 5 micrometers.

The thin film components may be precisely formed using a variety of suitable subtractive, semi-additive, or fully additive processes. For example, physical vapor deposition and/or chemical deposition may be used. For instance, in some embodiments, the thin film components may be formed using sputtering, a type of physical vapor deposition. A variety of other suitable processes may be used, however, including plasma-enhanced chemical vapor deposition (PECVD), electroless plating, and electroplating, for example. Lithography masks and etching may be used to produce the desired shape of the thin film components. A variety of suitable etching techniques may be used including dry etching using a plasma of a reactive or non-reactive gas (e.g., argon, nitrogen, oxygen, chlorine, boron trichloride) and/or wet etching.

In some embodiments, the coupler may include at least one adhesion layer in contact with one or more of the thin-film components. The adhesion layer may be or include a variety of materials that are suitable for improving adhesion between the thin-film components and adjacent layers, such as the base substrate, dielectric layer, and/or cover layer. As examples, the adhesion layer may include at least one of Ta, Cr, TaN, TiW, Ti, or TiN. For instance, the adhesive layer may be or include tantalum (Ta) (e.g., tantalum or an oxide or nitride thereof) and may be formed between the microstrips and the base substrate to improve adhesion therebetween. Without being bound by theory, the material of the adhesion layer may be selected to overcome phenomena such as lattice mismatch and residual stresses.

The adhesion layer(s) may have a variety of suitable thicknesses. For example, in some embodiments, the thicknesses of the adhesion layer(s) may range from about 100 angstroms to about 1000 angstroms, in some embodiments from about 200 angstroms to about 800 angstroms, in some embodiments from about 400 angstroms to about 600 angstroms.

As indicated above, the coupler may be configured for surface mounting to a mounting surface, such as a printed circuit board (PCB), using the port(s) exposed along the bottom surface of the coupler for surface mounting the component. For example, the coupler may be configured for grid array-type surface mounting, such as land grid array (LGA) type mounting, ball grid array (BGA) type mounting, or any other suitable type of grid array-type surface mounting. As such, the port(s) may not extend along side surfaces of the base substrate, for example as with a surface mount device (SMD). As such, in some embodiments side surfaces of the base substrate and/or coupler may be free of conductive material.

In some embodiments, the coupler may include a first protective layer exposed along a bottom surface of the coupler and/or a second protective layer exposed along a top surface of the coupler. For example, the first protective layer may be formed over the first surface of the cover layer. In some embodiments, the second protective layer may be formed over the second surface of the monolithic base substrate. The first protective layer and/or second protective layer may include a layer of a polymeric material (e.g., polyimide), SiNO, $Al_2O_3$, $SiO_2$, $Si_3N_4$, benzocyclobutene, or glass. The first protective layer and/or second protective layer may have thicknesses that range from about 1 micron to about 300 microns, in some embodiments from about 5 microns to about 200 microns, and in some embodiments from about 10 microns to about 100 microns.

I. Example Embodiments

FIG. 1 illustrates a schematic view of a coupler 100 in accordance with aspects of the present disclosure. The coupler 100 may include an input port 102, output port 104, coupling port 106, and ground port 108. A first inductor 107 may be inductively coupled with a second inductor 109. The second inductor 109 may be connected between the input port 102 and the output port 104.

A thin film circuit 111 may electrically connect the first thin film inductor 107 with the coupling port 106 and/or the ground port 108. The thin film circuit 111 may include at least one thin film component. For example, the thin film circuit 111 may include a first capacitor 110 electrically connected between the coupling port 106 and the ground port 108. The thin film circuit 111 may include a second capacitor 112 and a first resistor 114 connected in series between the coupling port 106 and the ground port 108. A second resistor 116 may be connected between the first inductor 107 and the ground port 108. A third resistor 122 may be connected with each of a third inductor 120 and the first inductor 107 at one end and with each of the first resistor 114 and the second capacitor 112 at another end. The third inductor 120 may be connected between the first inductor 107 and the coupling port 106.

Figure 2:
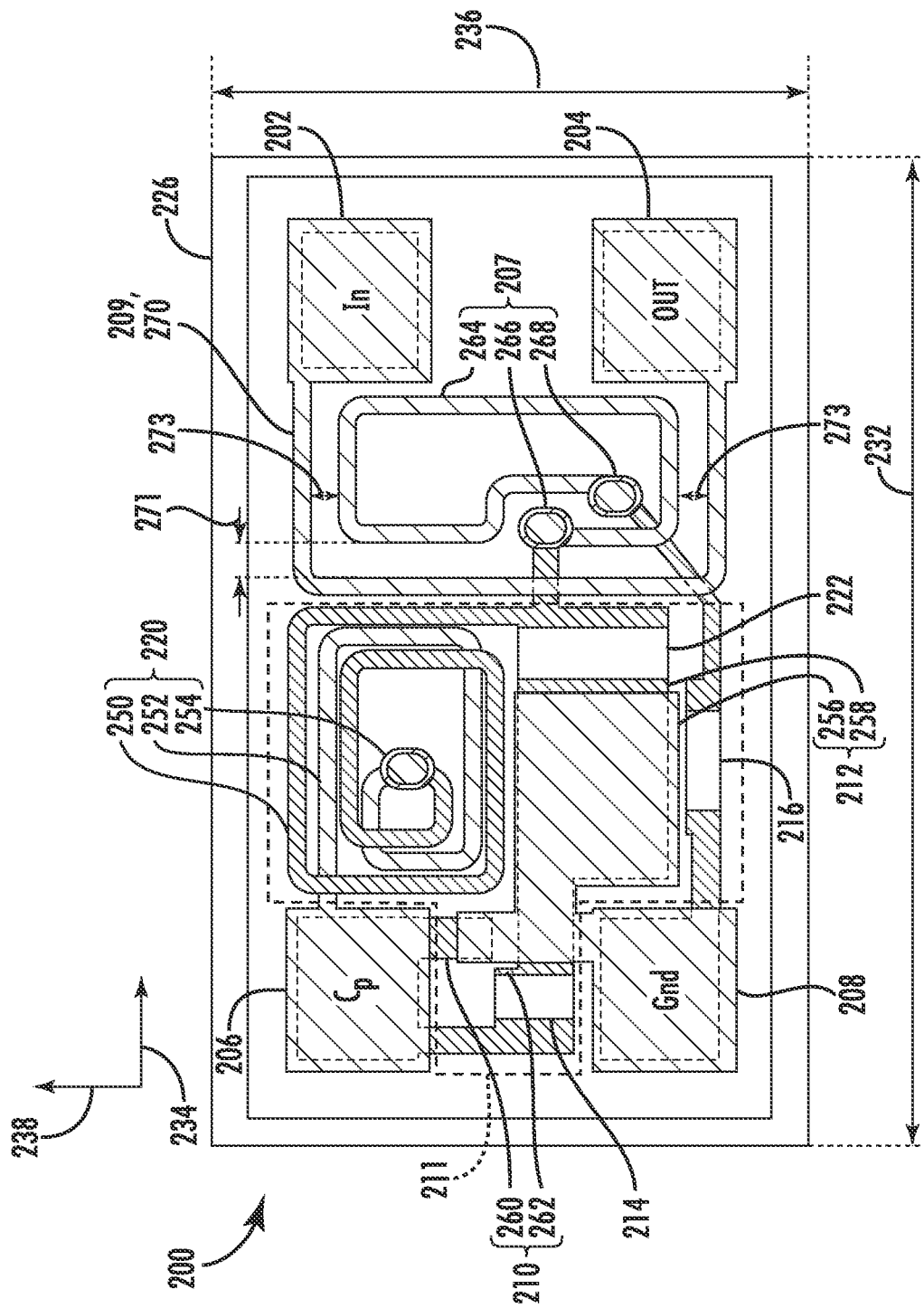
FIG. 2 illustrates a top down view of an embodiment of a compact thin film surface mountable coupler in accordance with aspects of the present disclosure.
Figure 3:
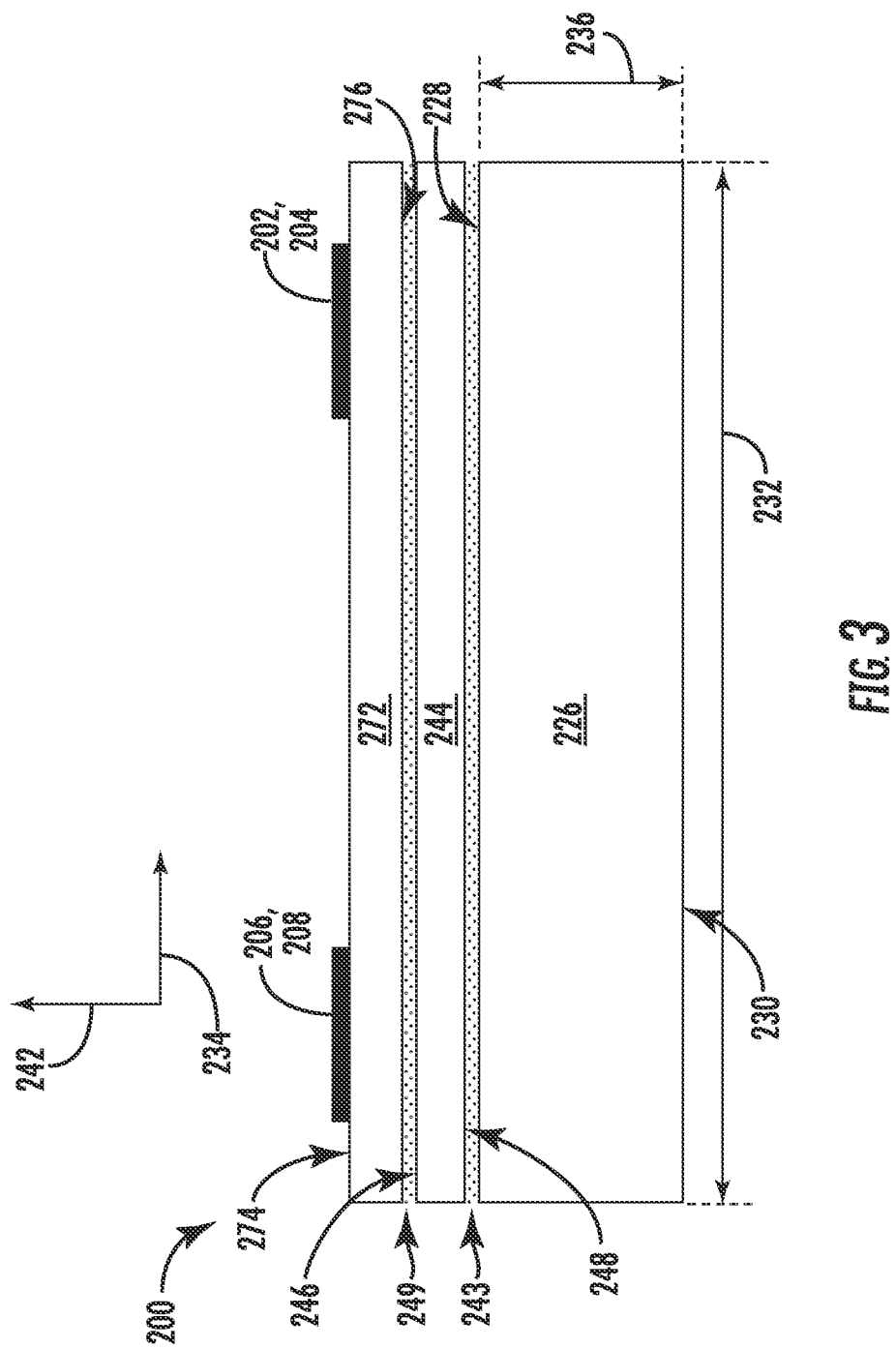
FIG. 3 is a side elevation view of the coupler of FIG. 2.

FIG. 2 illustrates a top down view of an embodiment of a coupler 200 according to aspects of the present disclosure. FIG. 3 is a side elevation view of the coupler 200 of FIG. 2. The coupler 200 may include a plurality of ports, including, for example, an input port 202, an output port 204, a coupling port 206, and/or a ground port 208.

In some embodiments, the coupler 200 may be generally configured as illustrated in FIG. 1. A first inductor 207 may be inductively coupled with a second inductor 209. The second inductor 209 may be connected between the input port 202 and the output port 204.

A thin film circuit 211 may electrically connect the first thin film inductor 207 with the coupling port 206. The thin film circuit 211 may include at least one thin film component. For example, the thin film circuit 211 may include a first capacitor 210 electrically connected between the coupling port 206 and the ground port 208. The thin film circuit 211 may include a second capacitor 212 and a first resistor 214 connected in series between the coupling port 206 and the ground port 208. The thin film circuit 211 may include a second resistor 216 connected between the first inductor 207 and the ground port 208. The thin film circuit 211 may include a third resistor 222 connected with each of a third inductor 220 and the first inductor 207 on a first end and with each of the first resistor 214 and the second capacitor 212 on a second end. The third inductor 220 may be connected between the first inductor 207 and the coupling port 206.

The coupler 200 may include a monolithic base substrate 226, which may include a ceramic material. Referring to FIGS. 2 and 3, the monolithic base substrate 226 may have a first surface 228 and a second surface 230. The monolithic base substrate 226 may have a length 232 in an X-direction 234. The monolithic base substrate 226 may have a width 236 (FIG. 2) in a Y-direction 238, and a thickness 240 (FIG. 3) in a Z-direction 242 that is perpendicular to the X-direction 234 and Y-direction 238. The length 232 of the coupler 200 may be less than about 1.4 mm. The width 236 of the coupler 200 may be less than about 1 mm.

A plurality of thin film components may be formed over the first surface 228 of the monolithic base substrate 226. For example, a first patterned conducive layer 243 (FIG. 3) may be formed over the first surface 228 of the monolithic base substrate 226 that includes and/or connects the thin film components. For example, the first patterned conducive layer may include the first resistor 214 and the second resistor 216. The first resistor 214 and/or second resistor 216 may be formed by selectively etching the first patterned conductive layer 243 that is formed over a resistive layer to expose the resistive layer, such that the first patterned conductive layer 243 is no longer connected across the first resistor 214, second resistor 216, and/or third resistor 222. The resistive layers of the resistors 214, 216, 222 may include a variety of suitable resistive materials, such as tantalum nitride.

The coupler 200 may include a dielectric layer 244 over the first surface 228 of the monolithic base substrate 226. The dielectric layer 244 may have a first surface 246 and a second surface 248 that is opposite the first surface 246. The second surface 248 of the dielectric layer 244 may face the first surface 228 of the monolithic base substrate 226. A second patterned conductive layer 249 may be formed over the first surface 228 of the monolithic base substrate 226. In FIG. 2, the first patterned conductive layer 243 is represented by darker shading than the second patterned conductive layer 249. The second patterned conductive layer 249 may include a first electrode 256 of the second capacitor 212, a second conductive layer 264 of the first inductor 207, a conductive layer 270 of the second inductor 209, and/or a second conductive layer 252 of the third inductor 220, for example as described below.

The third inductor 220 may include the first conductive layer 250 formed over the first surface 228 of the monolithic base substrate 226, a second conductive layer 252 formed over the first surface 246 of the dielectric layer 244, and a via 254 connecting the first conductive layer 250 with the second conductive layer 252. The second conductive layer 252 may be connected with the coupling port 206. The first conductive layer 250 may be connected with the third resistor 222.

The first and second thin film capacitors 210, 212 may include respective electrodes that are spaced apart by the dielectric layer 244. For example, the second thin film capacitor 212 may include a first electrode 256 formed over the first surface 228 of the monolithic base substrate 226 and a second electrode 258 may be formed over the first surface 246 of the dielectric layer 244. The first electrode 256 may be connected with the ground port 208. The second electrode 258 may be connected with each of the first resistor 214 and the second resistor 222.

The first thin film capacitor 210 may include a first electrode 260 formed over the first surface 228 of the monolithic base substrate 226 and a second electrode 262 formed over the first surface 246 of the dielectric layer 244. The first electrode 260 of the first thin film capacitor 210 may be connected with the coupling port 206. In some embodiments, the second electrode 262 of the first thin film capacitor 210 may be integrally formed (e.g., as part of the same conductive layer) with the second capacitor 258 of the second thin film capacitor 212.

The first inductor 207 may include a conductive layer 264 formed over the first surface 246 of the monolithic base substrate 226. The conductive layer 264 may form a loop. The first inductor 207 may include a first via 266 and a second via 268 connected with the conductive layer 264 with patterned conductive layer 243. For example, the first via 266 may connect the conductive layer 264 with the third resistor 222 and the first conductive layer 250 of the third inductor 220. The second via 268 may connect the conductive layer 264 with the second resistor 216.

The second inductor 209 may include a conductive layer 270 connected with each of the input port 202 and the output port 204. The conductive layer 270 may be inductively coupled with the first inductor 207. The second inductor 209 may be approximately evenly spaced apart from the first inductor 207 in an X-Y plane that is parallel with the first surface 228 of the monolithic base substrate 226 along at least a portion of the conductive layer 264 of the first inductor 207. For example, the second inductor 209 may be spaced apart from the first inductor 207 by a first spacing distance 271 in the Y-direction 238 and by a second spacing distance 273 in the X-direction 234. The first spacing distance 271 may be approximately equal to the second spacing distance 273. The first spacing distance 271 may be approximately uniform across sections of the inductors 207, 209 that are elongated in the Y-direction 238. The second spacing distance 273 may be approximately uniform across sections of the inductors 218, 224 that are elongated in the X-direction 234.

Referring to FIG. 3, the coupler 200 may include a cover layer 272 formed over the second surface 246 of the dielectric layer 244. The cover layer 272 may have a first surface 274 and a second surface 276. The second surface 276 of the cover layer 272 may face the first surface 246 of the dielectric layer 244. The cover layer 272 may include a variety of suitable materials, such as silicon oxynitride.

In some embodiments, a first protective layer may be formed over the first surface 274 of the cover layer 272. The first protective layer may include a variety of suitable materials, such as polyimide.

Referring to FIG. 3, the ports 202, 204, 206, 208 may extend through the cover layer 272 (and first protective layer if present) and may electrically connect with the first patterned conductive layer 243 and/or the second patterned conductive layer 249. More specifically, referring to FIG. 2, the coupling port 206 may be electrically connected with each of the second conductive layer 252 of the second capacitor 212, the first electrode 260 of the first capacitor 210, and the first resistor 214. Each of the input port 202 and output port 204 may be electrically connected with the conductive layer 270 of the second inductor 209. The ground port 208 may be electrically connected with each of the second resistor 216 and the first electrode 256 of the second capacitor 212.

The ports 202, 204, 206, 208 may protrude beyond the first surface 274 of the cover layer 272 such that the coupler 200 may be mounted and electrically connected (e.g., to a printed circuit) via the ports 202, 204, 206, 208. The ports 202, 204, 206, 208, may be formed by selectively etching followed by deposition of a first conductive material (e.g., copper), for example using electroplating. The ports 202, 204, 206, 208 may include one or more layers over the first conductive material, such as plating of tin, nickel, or a mixture thereof.

Figure 4:
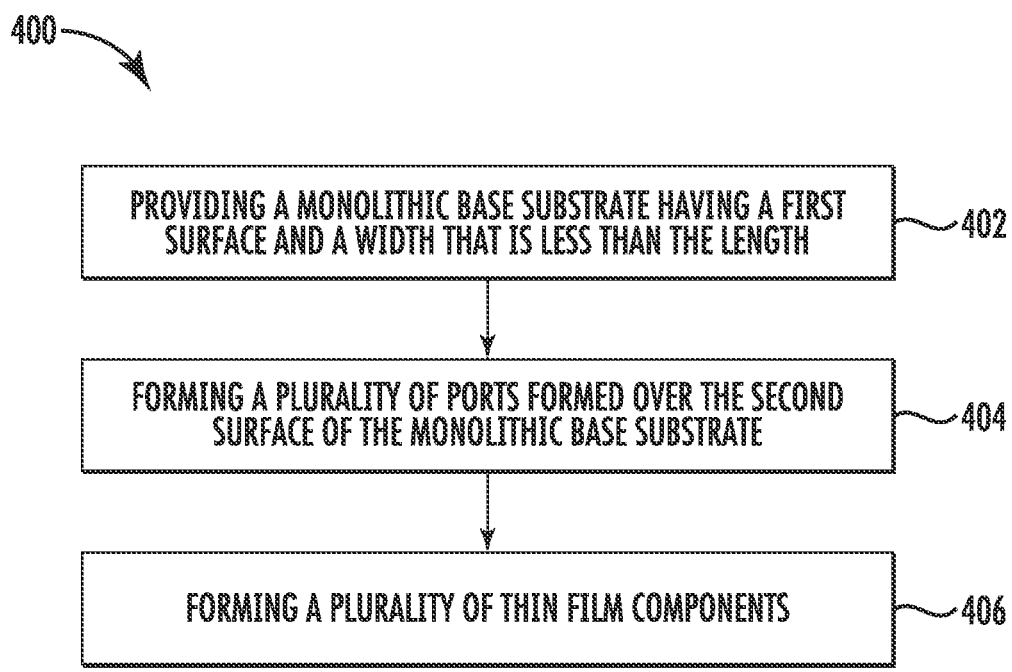
FIG. 4 is a flowchart of a method for forming a surface mountable coupler according to aspects of the present disclosure.

Referring to FIG. 4, aspects of the present disclosure are directed to a method 400 for forming a surface mountable coupler. In general, the method 400 will be described herein with reference to the thin film coupler 200 described above with reference to FIGS. 1-3. However, it should be appreciated that the disclosed method 400 may be implemented with any suitable thin film coupler. In addition, although FIG. 4 depicts steps performed in a particular order for purposes of illustration and discussion, the methods discussed herein are not limited to any particular order or arrangement. One skilled in the art, using the disclosures provided herein, will appreciate that various steps of the methods disclosed herein can be omitted, rearranged, combined, and/or adapted in various ways without deviating from the scope of the present disclosure.

The method 400 may include, at (402), providing a monolithic base substrate having a first surface, for example as described above with reference to FIGS. 2 and 3. The monolithic base substrate may have a second surface opposite the bottom surface, a length in an x-direction, and a width in a y-direction that is perpendicular to the x-direction, the width being less than the length, for example as described above with reference to FIGS. 2 and 3.

The method 400 may include, at (404), forming a plurality of ports over the first surface of the monolithic base substrate. The ports may electrically contact a first patterned conductive layer and/or a second patterned conductive layer, for example as described above with reference to FIGS. 2 and 3.

The method 400 may include, at (406), forming a plurality of thin film components. For example, the plurality of thin film components may include the first thin film inductor 207 and the second thin film inductor 209 that is inductively coupled with the first thin film inductor 207 and electrically connected between the input and output ports 202, 204, for example, as described above with reference to FIGS. 2 and 3. The plurality of thin film components may include the thin film circuit 211, for example, as described above with reference to FIGS. 2 and 3.

II. Simulation Data

Figure 5:
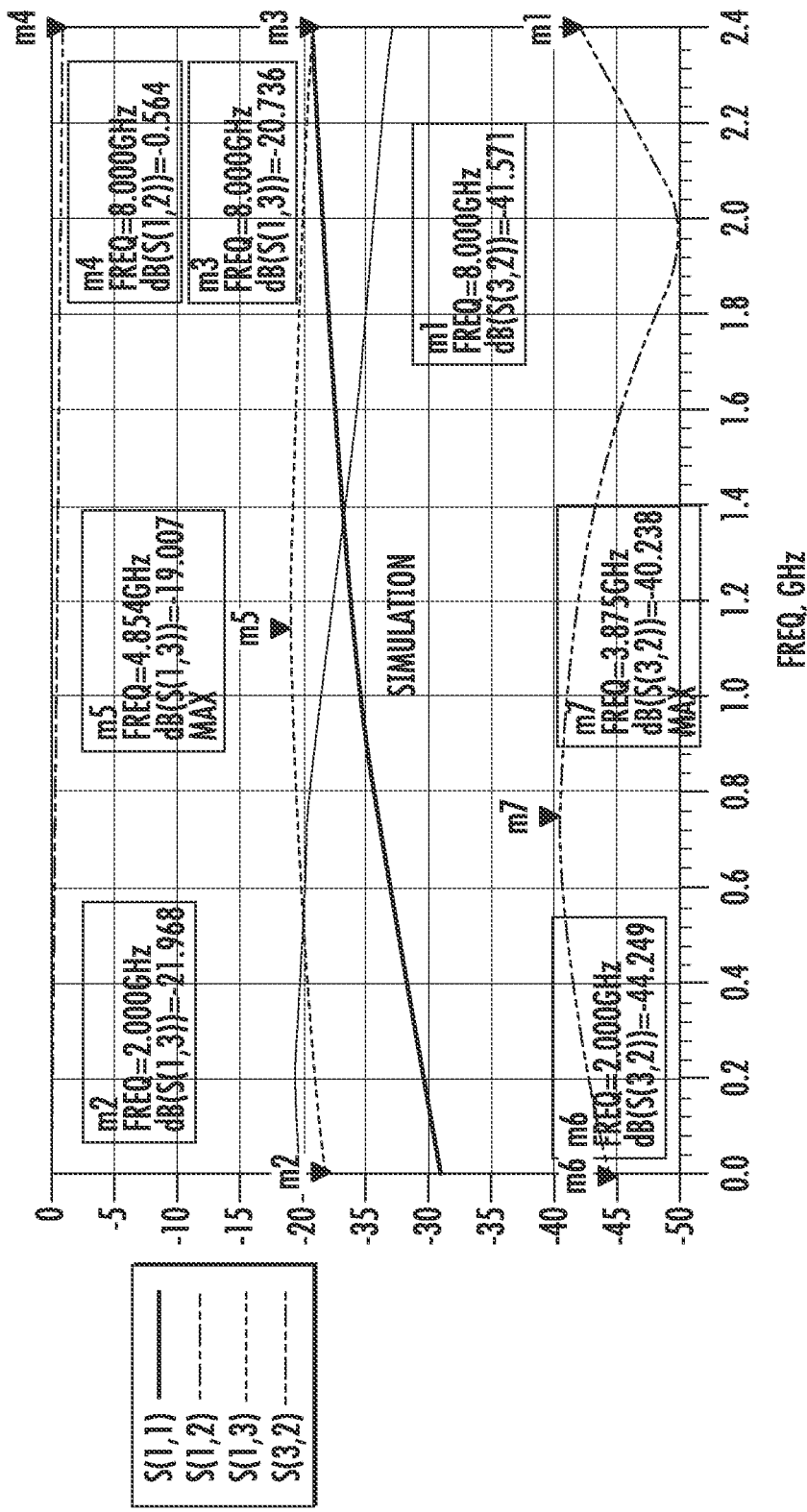
FIG. 5 is a graph of theoretically calculated S-parameters for the coupler of FIGS. 2 and 3 across a frequency range extending from 2 GHz to 8 GHz.

FIG. 5 represents theoretically calculated S-parameters for the coupler 200 of FIGS. 2 and 3 in accordance with aspects of the present disclosure across a frequency range extending from 2 GHz to 8 GHz. As is understood in the art, the S-parameters are expressed with subscripts in the following form: S(a,b). The values, a and b, indicate port numbers associated with the S-parameter such that each S-parameter can understood to represent the signal resulting at port b as a result of signal input at port a. As is understood in the art, the S-parameters are commonly referenced as follows:

| S-Parameter | Name |
|---|---|
| S(1, 1) | Return Loss |
| S(1, 2) | Insertion Loss |
| S(1, 3) | Coupling Factor |
| S(1, 4) | Isolation Factor |

Referring to FIG. 5, the coupling factor, S(3,1), equals −21.968 dB at 2 GHz, −19.007 dB at 4.854 GHz, and −20.736 dB at 8 GHz. Thus, the coupler exhibits very even coupling across a wide coupling frequency range. More specifically, the coupling factor varies about 3 dB from 2 GHz to 8 GHz. Thus in this example, the coupling frequency range spans 6 GHz, from 2 GHz to 8 GHz. However, in other embodiments, the coupling frequency range may span a smaller frequency range (e.g., 4 GHz, 3 GHz, 2 GHz, or less) or larger frequency range (e.g., 7 GHz, 8 GHz, or more). Additionally, the coupling frequency range may have a lower limit that ranges from about 250 MHz to about 6 GHz.

As seen in FIG. 5, the coupler may exhibit excellent insertion loss characteristics, S(1,2). For example the insertion loss, S(1,2), may be −0.564 dB or greater from 2 GHz to 8 GHz. Additionally, as seen in FIG. 5, S(3,2) may be −40.238 dB or less from 2 GHz to 8 GHz.

III. Testing

Testing for coupling factor, insertion loss, return loss, and other S-parameter characteristics may be performed using a source signal generator (e.g., a 1306 Keithley 2400 series Source Measure Unit (SMU), for example, a Keithley 2410-C SMU). For example, an input signal may be applied to the input port of the coupler, and a coupled signal may be measured at the coupling port of the coupler using the source signal generator.

IV. Applications

The input and output port of the coupler may be operatively connected with a signal source component. The coupling port and/or ground port of the coupler may be used to provide a coupled signal to a separate component (e.g., for monitoring or control of the signal source component). For example, the coupled line may provide a coupled signal to a feedback control loop associated with an amplifier of a radio frequency transmitter.

The disclosed coupler may be used in a variety of applications. Example applications include WiFi, Worldwide Interoperability for Microwave Access (WiMAX), Wireless Broadband (WIBRO), Long Term Evolution (LTE), Bluetooth and/or Low Power Radio Gateway applications. Additional examples include power detection, frequency detection, and voltage standing wave ratio (VSWR) monitoring.

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A surface mountable coupler comprising:
a monolithic base substrate having a first surface, a second surface, a length in an X-direction, and a width in a Y-direction that is perpendicular to the X-direction;
a plurality of ports formed over the first surface of the monolithic base substrate;
a first thin film inductor;
a second thin film inductor that is inductively coupled with the first thin film inductor; and
at least one thin film component,
wherein a width of the coupler is less than about 1.2 mm.

2. The coupler of claim 1, wherein the at least one thin film component of the thin film circuit comprises a layer having a thickness that is less than about 50 microns.

3. The coupler of claim 1, wherein the at least one thin film component of the thin film circuit comprises a thin film resistor.

4. The coupler of claim 3, wherein the thin film resistor comprises tantalum nitride.

5. The coupler of claim 1, wherein the coupler comprises a dielectric layer arranged over the first surface of the monolithic base substrate, the dielectric layer having a first surface and a second surface, the second surface of the dielectric layer facing the first surface of the monolithic base substrate, and wherein the at least one thin film component comprises a thin film capacitor comprising a first electrode formed over the first surface of the monolithic base substrate and a second electrode formed over the first surface of the dielectric layer.

6. The coupler of claim 1, wherein the coupler comprises a dielectric layer arranged over the first surface of the monolithic base substrate, the dielectric layer having a first surface and a second surface, the second surface of the dielectric layer facing the first surface of the monolithic base substrate, and further comprising a cover layer formed over the first surface of the dielectric layer.

7. The coupler of claim 6, wherein the cover layer comprises silicon oxynitride.

8. The coupler of claim 1, wherein the at least one thin film component comprises a third thin film inductor.

9. The coupler of claim 1, further comprising:
a dielectric layer arranged over the first surface of the monolithic base substrate, the dielectric layer having a first surface and a second surface, the second surface of the dielectric layer facing the first surface of the monolithic base substrate; and
a third thin film inductor comprising a first conductive layer formed over the first surface of the monolithic base substrate, a second conductive layer formed over the first surface of the dielectric layer, and a via connecting the first conductive layer with the second conductive layer.

10. The coupler of claim 1, wherein the at least one thin film component comprises a third thin film inductor and a thin film capacitor, and wherein the third thin film inductor and the thin film capacitor are electrically connected in parallel with each other and each electrically connected in series between the first thin film inductor and a coupling port of the plurality of ports.

11. The coupler of claim 1, wherein a length of the coupler is less than about 2 mm.

12. The coupler of claim 1, wherein a footprint of the coupler is less than about 3 mm$^2$.

13. The coupler of claim 1, wherein the monolithic base substrate comprises a ceramic material.

14. The coupler of claim 1, wherein a coupling factor of the coupler varies less than about 4 dB across a coupling frequency range that has a lower limit that ranges from about 250 MHz to about 6 GHz and an upper limit that is at least 2 GHz greater than the lower limit.

15. A surface mountable coupler comprising:
a monolithic base substrate;
at least one port exposed along an exterior of the coupler for surface mounting the coupler; and
at least one thin film component;
wherein a length of the coupler is less than about 2 mm; and
wherein the at least one thin film component comprises a thin film resistor.

16. The coupler of claim 15, wherein the thin film resistor comprises tantalum nitride.

17. The coupler of claim 15, further comprising:
a dielectric layer arranged over the first surface of the monolithic base substrate, the dielectric layer having a first surface and a second surface, the second surface of the dielectric layer facing the first surface of the monolithic base substrate; and
a thin film capacitor comprising a first electrode formed over the first surface of the monolithic base substrate and a second electrode formed over the first surface of the dielectric layer.

18. The coupler of claim 15, further comprising a dielectric layer arranged over the first surface of the monolithic base substrate, the dielectric layer having a first surface and a second surface, the second surface of the dielectric layer facing the first surface of the monolithic base substrate, and wherein the at least one thin film component comprises a thin film inductor comprising a first conductive layer formed over the first surface of the monolithic base substrate, a second conductive layer formed over the first surface of the dielectric layer, and a via connecting the first conductive layer with the second conductive layer.

19. The coupler of 15, wherein:
the at least one port comprises a coupling port, an input port, and an output port; and
the at least one thin film component comprises:
a first thin film inductor; and
a second thin film inductor that is inductively coupled with the first thin film inductor and electrically connected between the input and output ports.

20. The coupler of claim 19, further comprising a thin film circuit electrically connecting the first thin film inductor with the coupling port.

21. The coupler of claim 20, wherein the thin film circuit comprises at least one of a thin film capacitor or a third thin film inductor.

22. The coupler of claim 19, wherein the first thin film inductor comprises a first conductive layer that is elongated in a first direction, and the second thin film inductor comprises a second conductive layer that is parallel with the first conductive layer and spaced apart from the first conductive layer in a second direction that is perpendicular to the first direction by an approximately even spacing distance along at least a portion of the first conductive layer.

23. The coupler of claim 15, further comprising a cover layer comprising silicon oxynitride formed over the second surface of the monolithic base substrate.

24. The coupler of claim 15, wherein a width of the coupler is less than about 1 mm.

25. The coupler of claim 15, wherein the monolithic base substrate comprises a ceramic material.

26. The coupler of claim 15, wherein a coupling factor of the coupler varies less than about 4 dB across a coupling frequency range that has a lower limit that ranges from about 250 MHz to about 6 GHz and an upper limit that is at least 2 GHz greater than the lower limit, and wherein the lower limit of the frequency range is about 2 GHz.

27. The coupler of claim 15, wherein the at least one thin film component comprises a layer having a thickness that is less than about 50 microns.

28. A method for forming a surface mountable coupler, the method comprising:
   providing a monolithic base substrate having a first surface, a second surface opposite the bottom surface;
   forming at least one port over the first surface of the monolithic base substrate;
   forming a first thin film inductor;
   forming a second thin film inductor that is inductively coupled with the first thin film inductor; and
   forming at least one thin film circuit that electrically connects the first thin film inductor with the coupling port, the thin film circuit comprising at least one thin film component,
   wherein a footprint of the surface mountable coupler is less than about 3 mm$^2$.

* * * * *